US007521979B2

(12) United States Patent
Tanimoto

(10) Patent No.: US 7,521,979 B2
(45) Date of Patent: Apr. 21, 2009

(54) TERNARY PULSE GENERATION CIRCUIT

(75) Inventor: Takashi Tanimoto, Gifu (JP)

(73) Assignee: Sanyo Electric Co., Ltd. (JP)

( * ) Notice: Subject to any disclaimer, the term of this patent is extended or adjusted under 35 U.S.C. 154(b) by 68 days.

(21) Appl. No.: 11/583,250

(22) Filed: Oct. 19, 2006

(65) Prior Publication Data

US 2007/0092026 A1 Apr. 26, 2007

(30) Foreign Application Priority Data

Oct. 26, 2005 (JP) ............................ 2005-310899

(51) Int. Cl.
*G06F 1/04* (2006.01)

(52) U.S. Cl. ...................................... 327/291; 327/294

(58) Field of Classification Search ...................... None
See application file for complete search history.

(56) References Cited

U.S. PATENT DOCUMENTS 4,583,224 A * 4/1986 Ishii et al. ..................... 714/10
5,512,846 A * 4/1996 Hori ........................... 326/105
5,528,168 A * 6/1996 Kleveland .................... 326/30
5,596,285 A * 1/1997 Marbot et al. ................. 326/30
5,710,563 A * 1/1998 Vu et al. ..................... 341/161
5,731,711 A * 3/1998 Gabara ....................... 326/30
5,770,957 A * 6/1998 Lee ........................... 327/109
6,166,670 A * 12/2000 O'Shaughnessy ........... 341/136
6,173,424 B1 * 1/2001 Voshell et al. ............... 714/718
6,204,683 B1 * 3/2001 Falconer ...................... 326/30
6,366,069 B1 * 4/2002 Nguyen et al. .............. 323/282
6,538,464 B2 * 3/2003 Muljono et al. ............... 326/27
6,731,263 B2 * 5/2004 Goto et al. .................... 345/98
6,747,475 B2 * 6/2004 Yuffe et al. ................... 326/30
6,795,372 B2 * 9/2004 Kim et al. ............. 365/230.06
7,327,630 B2 * 2/2008 Park .......................... 365/226

FOREIGN PATENT DOCUMENTS

JP 2001-119009 4/2001

* cited by examiner

*Primary Examiner*—Cassandra Cox
(74) *Attorney, Agent, or Firm*—Cantor Colburn LLP

(57) ABSTRACT

A ternary pulse generation circuit includes a logic circuit section including three logic elements and a switching control section including three switching elements each controlled by an output of corresponding one of the three logic elements, and the circuit outputs three different voltage values in a switching manner by controlling the three switching elements such that the three switching elements are not turned on simultaneously.

4 Claims, 6 Drawing Sheets

TERNARY PULSE GENERATION CIRCUIT

PRIORITY INFORMATION

This application claims priority to Japanese Patent Application No.2005-310899, filed on Oct. 26, 2005, which is incorporated herein by reference in its entirety.

BACKGROUND OF THE INVENTION

1. Field of the Invention

The present invention relates to a ternary pulse generation circuit in which the through current of a switching element is suppressed in order to reduce power consumption.

2. Description of Related Art

Solid state imaging devices are devices which comprise a photoelectric conversion section and a charge transfer section for transferring an information charge generated by the photoelectric conversion section in accordance with incident light to the charge transfer section, and which thereby obtain image data. Examples of solid-state imaging devices include CCDs (Charge Coupled Device) or the like.

A frame transfer type CCD solid-state imaging device, for example, includes an imaging section which functions both as a photoelectric conversion element and a vertical shift register, a storage section including a vertical shift register for temporarily buffering an information charge transferred from the imaging section, a horizontal transfer section having a horizontal shift register for transferring the information charge corresponding to one line sequentially output from the storage section, and an output section for outputting a voltage in accordance with the information charge output bit by bit from the horizontal transfer section. During image capturing using such a frame transfer type CCD solid-state imaging device, an information charge corresponding to the intensity of incident light is generated for each bit of the photoelectric conversion elements disposed in a matrix in the imaging section. Further, at the time of frame transfer, the information charge generated by each bit of the imaging section corresponding to one frame is vertically transferred by the vertical shift register and buffered in the storage section, and the information charge buffered in the storage section corresponding to one line is sequentially transferred to the horizontal transfer section.

In the solid-state imaging device, in order to increase the storage capacity for the information charge at the time of image capturing and the transfer efficiency for the information charge at the time of vertical transfer, it is necessary to control a clock pulse having different voltage values for image capturing and vertical transfer with a ternary clock pulse to be applied to the imaging section and the storage section.

SUMMARY OF THE INVENTION

In accordance with one aspect of the present invention, there is provided a ternary pulse generation circuit which outputs three different voltage values, comprising a logic circuit section including three logic elements, and a switching control section including three switching elements each controlled by an output of corresponding one of the three logic elements, wherein each of the three switching elements has one terminal to which each of three different voltage values is input and another terminal which outputs a voltage value, and the switching control section controls the three switching elements such that the three switching elements are not simultaneously turned on, thereby outputting the three different voltage values in a switching manner.

BRIEF DESCRIPTION OF THE DRAWINGS

Preferred embodiments of the present invention will be described in detail based on the following figures, wherein.

DETAILED DESCRIPTION OF PREFERRED EMBODIMENTS

Preferred embodiments of the present invention will be described in detail with reference to the accompanying drawings.

First Embodiment

Figure 1:
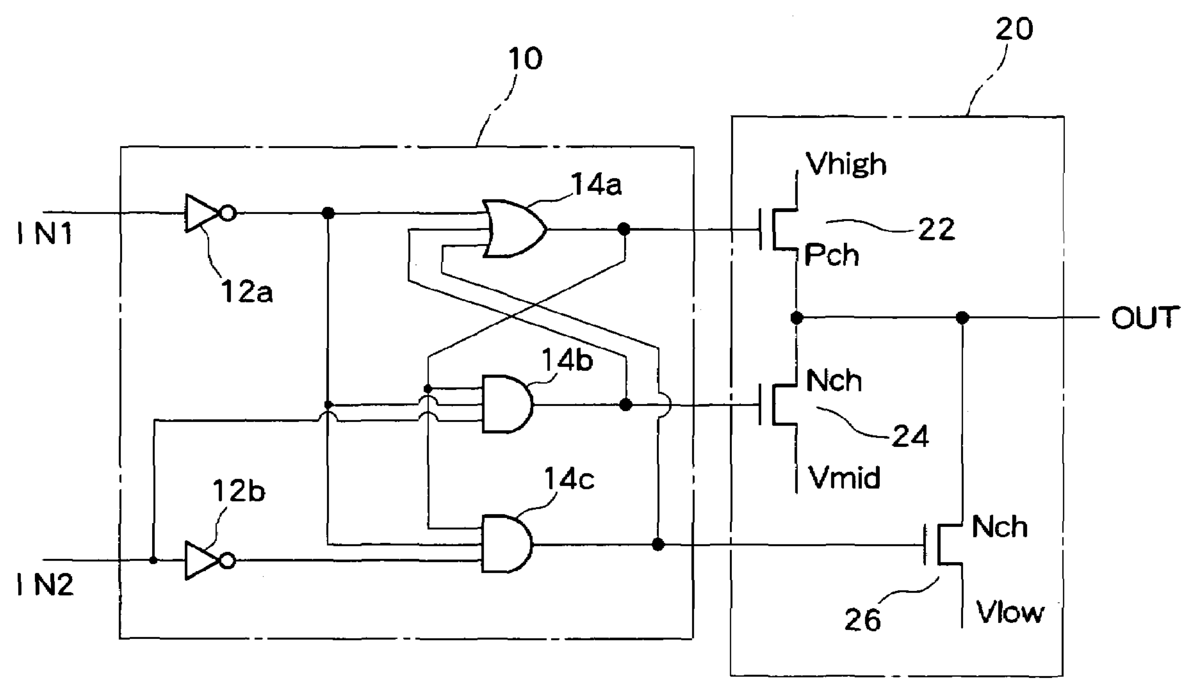
FIG. 1 is a circuit diagram showing a structure of a ternary pulse generation circuit according to a first embodiment of the present invention.

As shown in FIG. 1, a ternary pulse generation circuit 100 according to a first embodiment of the present invention includes a logic circuit section 10 and a switching control section 20. The logic circuit section 10 includes logic elements for generating and outputting a control signal which controls switching of switching elements. The switching control section 20 includes a plurality of switching elements for selecting one of three predetermined voltage values $V_{high}$, $V_{mid}$, and $V_{low}$ in accordance with the control signal generated by the logic circuit section 10 and outputting the selected voltage value as an output signal OUT. The ternary pulse generation circuit 100 may be used as a driver for driving the imaging section in a CCD solid-state imaging device of frame transfer type, for example. However, the ternary pulse generation circuit 100 is not limited to the above use example, and can similarly be used as a driver in other devices.

The logic circuit section 10 can be formed by including NOT elements 12*a* and 12*b* which also function as buffers, an OR element 14*a,* and AND elements 14*b* and 14*c*. Each of the OR element 14*a* and the AND elements 14*b* and 14*c* has three input terminals. Further, the switching control section 20 is composed by including a P channel MOSFET 22 and N channel MOSFETs 24 and 26.

A first input signal IN1 is input to the NOT element 12*a* and a second input signal IN2 is input to the NOT element 12*b*. The second input signal IN2 is also input to the AND element 14*b*. The output of the NOT element 12*a* is input to the OR element 14*a* and the AND elements 14*b* and 14*c*. The output of the NOT element 12*b* is input to the AND element 14*c*.

The output of the OR element 14*a* is input to a gate of the MOSFET 22 in the switching control section 20 and to the AND elements 14*b* and 14*c*. The output of the AND element 14*b* is input to a gate of the MOSFET 24 in the switching control section 20 and to the OR element 14*a*. The output of the AND element 14*c* is input to a gate of the MOSFET 26 in the switching control section 20 and to the OR element 14*a*.

A first voltage $V_{high}$ is applied to a source of the MOSFET 22 in the switching control section 20, a second voltage $V_{mid}$ which is lower than the first voltage $V_{high}$ is applied to a source of the MOSFET 24, and a third voltage $V_{low}$ which is lower than the second voltage $V_{mid}$ is applied to a source of the MOSFET 26. The first voltage $V_{high}$, the second voltage $V_{mid}$, and the third voltage $V_{low}$ can be 3V, −5V, and −7V, respectively, for example. Drains of the MOSFETs 22, 24, and 26 are connected to a common output terminal.

Figure 2:
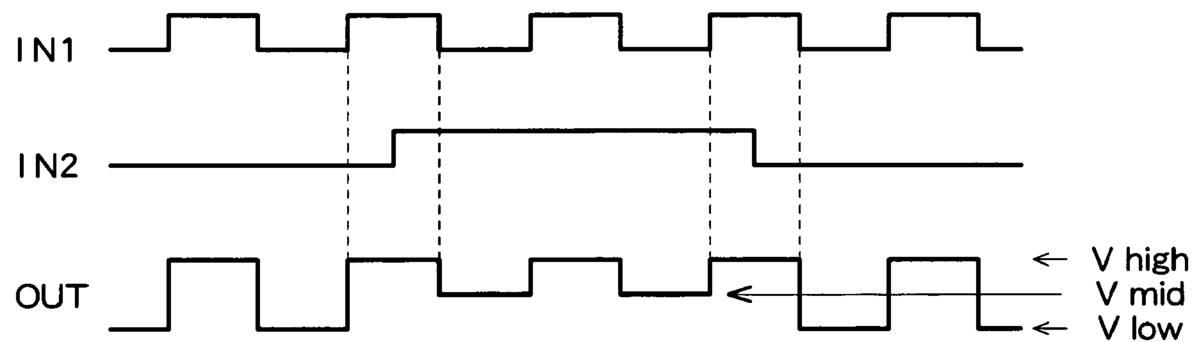
FIG. 2 is a timing chart showing the operation of the ternary pulse generation circuit according to the first embodiment of the present invention.

Referring to FIG. 2, the operation of the ternary pulse generation circuit 100 will be described. FIG. 2 is a timing chart showing changes of the output signal OUT with respect to the states of the first and second input signals IN1 and IN2.

When both the first in put signal IN1 and the second input signal IN2 are at a low level, only the MOSFET 26 is in an ON state while the MOSFETs 22 and 24 are OFF. Consequently, the output signal OUT has the third voltage value $V_{low}$. When the first input signal IN1 is at a high level and the second input signal IN2 is at a low level, only the MOSFET 22 is in an ON state while the MOSFETs 24 and 26 are OFF. Also, when both the first input signal IN1 and the second input signal IN2 are at a high level, only the MOSFET 22 is in an ON state while the MOSFETs 24 and 26 are OFF. Consequently, the output signal OUT has the first voltage value $V_{high}$. When the first input signal IN1 is at a low level and the second input signal IN2 is at a high level, only the MOSFET 24 is in an ON state while the MOSFETs 22 and 26 are OFF. Consequently, the output signal OUT has the second voltage value $V_{mid}$.

At this point, during the period in which the first input signal IN1 is high, the input signal IN2 is made to change from a low level to a high level, as shown in FIG. 2. This allows switching of the voltage value of the output signal OUT between the first voltage $V_{high}$ and the second voltage $V_{mid}$, or between the first voltage $V_{high}$ and the third voltage $V_{low}$, thereby generating a ternary pulse.

In the logic circuit section 10, the output of the OR element 14*a* is fed back to the inputs of the AND elements 14*b* and 14*c* and also the outputs of the AND elements 14*b* and 14*c* are fed back to the input of the OR element 14*a*. By mutually feeding back the outputs of the three logic elements, namely the OR element 14*a* and the AND elements 14*b* and 14*c,* which output control signals to the three MOSFETs 22, 24, and 26 which are switching elements as described above, it is possible to control the switching elements included in the switching control section 20, namely the MOSFETs 22, 24, and 26, such that only one of these switching elements 22, 24, and 26 is turned ON. Specifically, it is possible to prevent the MOSFETs 22 and 24 from being simultaneously ON to thereby prevent connection of the sources of the MOSFETs 22 and 24, to prevent the MOSFETs 22 and 26 from being simultaneously ON to thereby prevent connection of the sources of the MOSFETs 22 and 26, and to prevent the MOSFETs 24 and 26 from being simultaneously ON to thereby prevent connection of the sources of the MOSFETs 24 and 26. As such, generation of a through current caused by turning a plurality of switching elements simultaneously ON can be prevented, so that the power consumption of the ternary pulse generation circuit 100 can be reduced.

Second Embodiment

Figure 3:
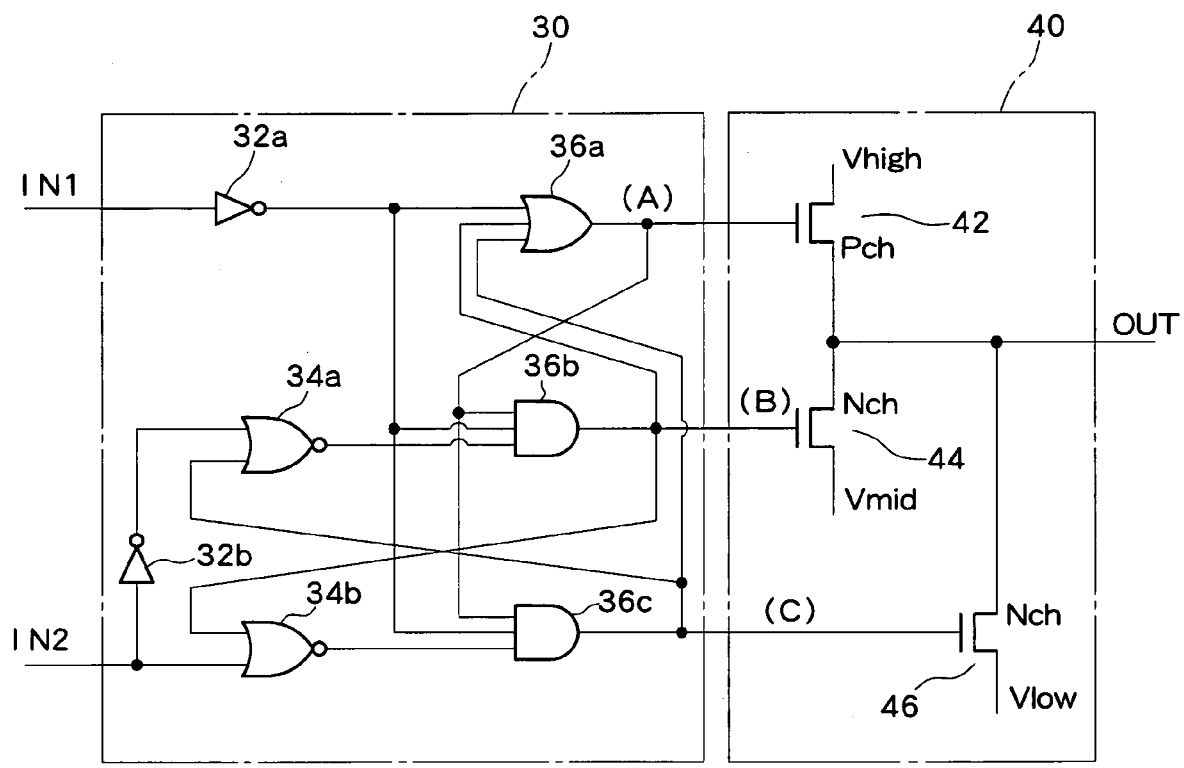
FIG. 3 is a circuit diagram showing a structure of a ternary pulse generation circuit according to a second embodiment of the present invention.

As shown in FIG. 3, a ternary pulse generation circuit 200 according to a second embodiment of the present invention includes a logic circuit section 30 and a switching control section 40. The logic circuit section 30 includes, similar to the first embodiment, logic elements for generating and outputting a control signal which controls switching of switching elements. Similar to the configuration of the first embodiment, the switching control section 40 of the second embodiment includes a plurality of switching elements for selecting one of three predetermined voltage values $V_{high}$, $V_{mid}$, and $V_{low}$ in accordance with the control signal generated by the logic circuit section 30 and outputting the selected voltage value as an output signal OUT. The ternary pulse generation circuit 200 may be used as a driver for driving the imaging section in a CCD solid-state imaging device of frame transfer type, for example. However, the ternary pulse generation circuit 200 is not limited to the above use example, and can similarly be used as a driver in other devices.

The logic circuit section 30 can be formed by including NOT elements 32*a* and 32*b* which also function as buffers, NOR elements 34*a* and 34*b* forming a multivibrator circuit, an OR element 36*a,* and AND elements 36*b* and 36*c*. Each of the OR element 36*a* and the AND elements 36*b* and 36*c* has three input terminals. Further, the switching control section 40 is composed by including a P channel MOSFET 42 and N channel MOSFETs 44 and 46.

A first input signal IN1 is input to the NOT element 32*a* and a second input signal IN2 is input to the NOT element 32*b.* The second input signal IN2 is further input to the NOR element 34*b.* The output of the NOT element 32*a* is input to the OR element 36*a* and AND elements 36*b* and 36*c.* The output of the NOT element 32*b* is input to the NOR element 34*a.* Further, the output of the NOR element 34*a* is input to the AND element 36*b,* and the output of the NOR element 34*b* is input to the AND element 36*c.*

The output A of the OR element 36*a* is input to a gate of the MOSFET 42 in the switching control section 40 and is also input to the AND elements 36*b* and 36*c.* The output of the AND element 36*b* is input to a gate of the MOSFET 44 in the switching control section 40 and is also input to the OR element 36*a* and the NOR element 34*b* forming the multivibrator circuit. The output of the AND element 36*c* is input to a gate of the MOSFET 46 in the switching control section 40 and is also input to the OR element 36*a* and the NOR element 34*a* forming the multivibrator circuit.

The switching control section 40 is composed of one p channel MOSFET 42 and two N channel MOSFETs 44 and 46, similar to the switching control section 20 of the first embodiment. A first voltage $V_{high}$ is applied to a source of the MOSFET 42 in the switching control section 40, a second voltage $V_{mid}$ which is lower than the first voltage $V_{high}$ is applied to a source of the MOSFET 44, and a third voltage $V_{low}$ which is lower than the second voltage $V_{mid}$ is applied to a source of the MOSFET 46. The first voltage $V_{high}$, the second voltage $V_{mid}$, and the third voltage $V_{low}$ can be 3V, −5V, and −7V, respectively, for example. Drains of the MOSFETs 42, 44, and 46 are connected to a common output terminal.

Figure 4:
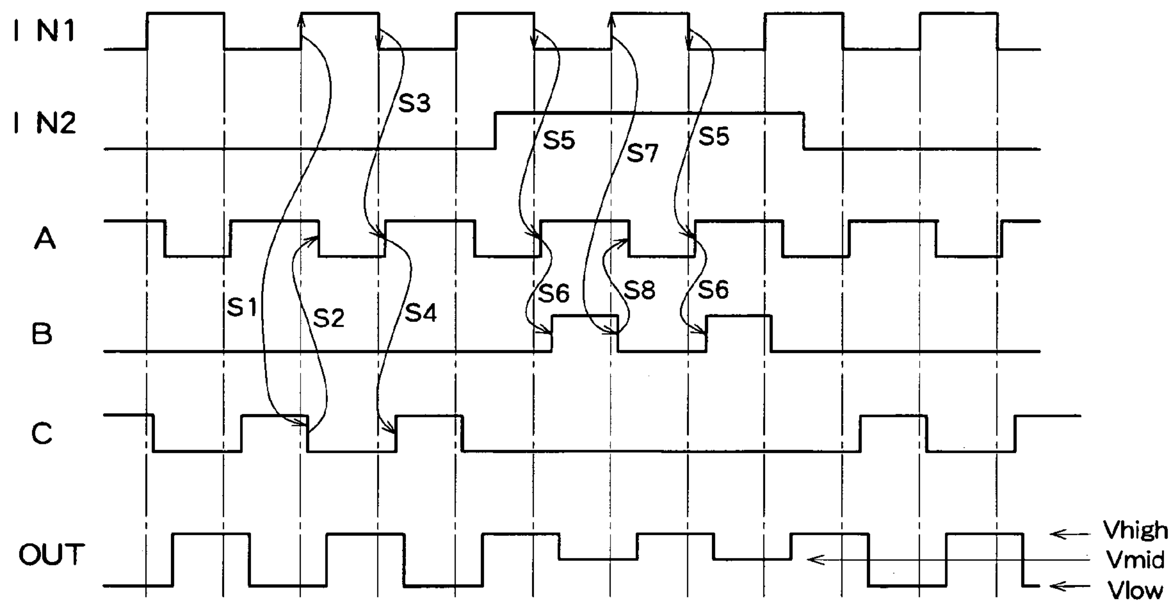
FIG. 4 is a timing chart showing the operation of the ternary pulse generation circuit according to the second embodiment of the present invention.

Referring to FIG. 4, the operation of the ternary pulse generation circuit 200 will be described. FIG. 4 is a timing chart showing changes of the outputs A, B, and C, and the output signal OUT with respect to the states of the first and second input signals IN1 and IN2.

When both the first input signal IN1 and the second input signal IN2 are at a low level, the outputs A and C are at a high level and the output B is at a low level. Thus, only the MOSFET 46 is in an ON state while the MOSFETs 42 and 44 are OFF. Consequently, the output signal OUT has the third voltage value $V_{low}$.

Then, when the first input signal IN1 changes to a high level while the second input signal IN2 remains at a low level, first, the output C of the AND element 36*c* changes to a low level (step S1). Subsequently, in response to the change of the AND element 36*c,* the output of the NOR element 34*a* forming the multivibrator changes to a high level and the output of the NOR element 34*b* changes to a low level (step S2). Consequently, the output A of the OR element 36*a* becomes a low level at a time later than the change of the output C of the AND element 36*c*. Namely, after the MOSFET 46 is turned in an OFF state, only MOSFET 42 is ON. Consequently, the voltage of the output OUT switches from the third voltage value $V_{low}$ to the first voltage value $V_{high}$.

When the first input signal IN1 changes to a low level while the second input signal IN2 remains at a low level, the output A of the OR element 36*a* returns to a high level some time later than the change of the input signal IN1 (step S3), and the output of the AND element 36*c* changes to a high level at a time later than the change of the OR element 36*a* (step S4). Consequently, the voltage value of the output signal OUT returns to the third voltage $V_{low}$.

When the second input signal IN2 changes to a high level while the first input signal IN1 remains at a high level, only the MOSFET 42 is in an ON state while the MOSFETs 44 and 46 are OFF. Consequently, the output signal OUT has the first voltage value $V_{high}$.

Then, when the first input signal IN1 changes to a low level while the second input signal IN2 remains at a high level, first, the output A of the OR element 36*a* changes to a high level (step S5). Subsequently, in response to the change of the output A of the OR element 36*a,* the output B of the AND element 36*b* changes to a high level. Namely, after the MOSFET 42 is turned in an OFF state, only MOSFET 44 is ON. Consequently, the voltage of the output signal OUT switches from the first voltage value $V_{high}$ to the second voltage value $V_{mid}$.

When the first input signal IN1 returns to a high level while the second input signal IN2 remains at a high level, the output B of the AND element 36*b* changes again to a low level some time later than the change of the input signal IN1 (step S7), and the output A of the OR element 36*a* changes to a low level at a time later than the change of the AND element 36*b* (step S8). Consequently, the voltage value of the output signal OUT changes back to the first voltage $V_{high}$.

As described above, it is possible to switch the output signal OUT between the first voltage value $V_{high}$ and the second voltage value $V_{mid}$, or between the first voltage value $V_{high}$ and the third voltage value $V_{low}$, with the switching elements of the switching control section 40 being controlled such that only one switching element is turned ON at one time. Further, in the ternary pulse generation circuit 200 according to the present embodiment, it is also possible to switch the output signal OUT between the second voltage value $V_{mid}$ and the third voltage value $V_{low}$, while controlling the switching elements of the switching control section 40 such that only one switching element is turned ON at one time.

In the logic circuit section 30, the output of the OR element 36*a* is fed back to the input of each of the AND elements 36*b* and 36*c* and also the outputs of the AND elements 36*b* and 36*c* are fed back, via the multivibrator, to the inputs of the AND elements 36*c* and 36*b,* respectively. By mutually feeding back the outputs of the three logic elements, namely the OR element 34*a* and the AND elements 36*b* and 36*c,* which output a control signal to the three MOSFETs 42, 44, and 46 which are switching elements as described above, it is possible to control the switching elements included in the switching control section 40, namely the MOSFETs 42, 44, and 46, such that only one of these switching elements is turned ON. Specifically, it is possible to prevent the MOSFETs 42 and 44 from being simultaneously ON to thereby prevent connection of the sources of the MOSFETs 42 and 44, to prevent the MOSFETs 42 and 46 from being simultaneously ON to thereby prevent connection of the sources of the MOSFETs 42 and 46, and to prevent the MOSFETs 44 and 46 from being simultaneously ON to thereby prevent connection of the sources of the MOSFETs 44 and 46. As such, generation of a through current caused by turning a plurality of switching elements simultaneously ON can be prevented, so that the power consumption of the ternary pulse generation circuit 200 can be reduced.

Third Embodiment

Figure 5:
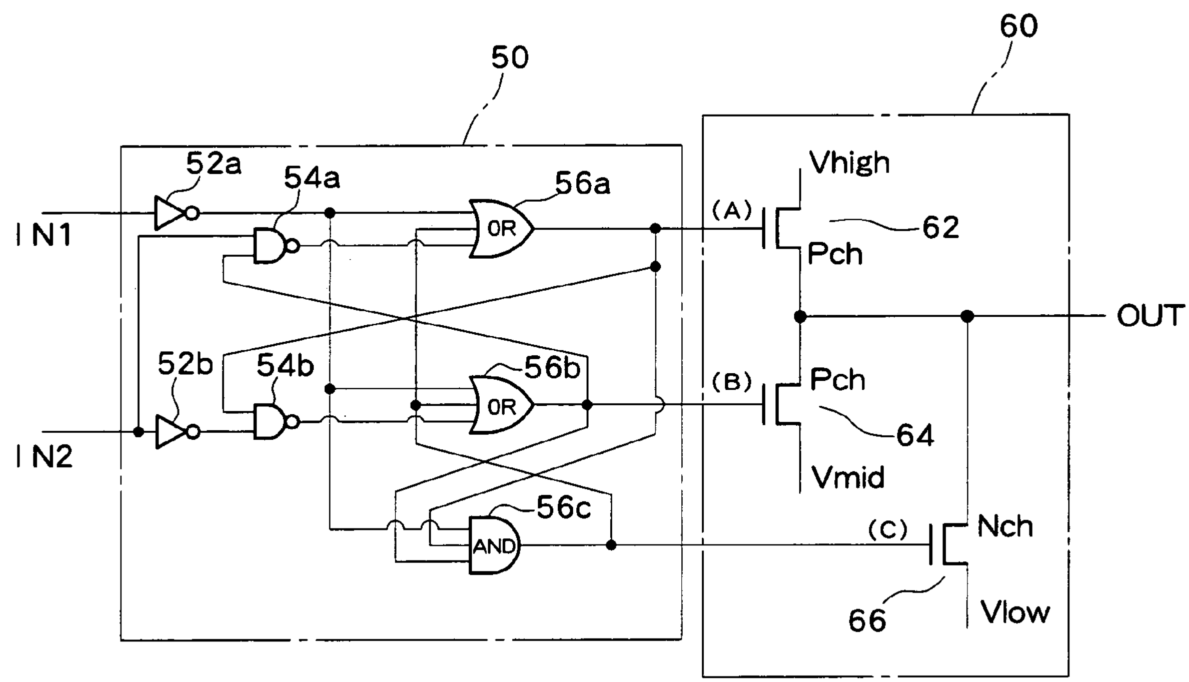
FIG. 5 is a circuit diagram showing a structure of a ternary pulse generation circuit according to a third embodiment of the present invention.

As shown in FIG. 5, a ternary pulse generation circuit 300 according to a third embodiment of the present invention includes a logic circuit section 50 and a switching control section 60. The logic circuit section 50 is similar to the configuration of the first embodiment in that it includes logic elements for generating and outputting a control signal which controls switching of switching elements. Also similar to the first embodiment, the switching control section 60 includes a plurality of switching elements for selecting one of three predetermined voltage values $V_{high}$, $V_{mid}$, and $V_{low}$ in accordance with the control signal generated by the logic circuit section 50 and outputting the selected voltage value as an output signal OUT. The ternary pulse generation circuit 300 may be used as a driver for driving the imaging section in a CCD solid-state imaging device of frame transfer type, for example. However, use of the ternary pulse generation circuit 300 is not limited to the above example, and the ternary pulse generation circuit 300 can similarly be used as a driver in other devices.

The logic circuit section 50 can be formed by including NOT elements 52*a* and 52*b* which also function as buffers, NAND elements 54*a* and 54*b* forming a multivibrator circuit, OR elements 56*a* and 56*b,* and an AND element 56*c*. Each of the OR elements 56*a* and 56*b* the AND element 56*c* has three input terminals. Further, the switching control section 60 is composed by including P channel MOSFETs 62 and 64 and an N channel MOSFET 66.

A first input signal IN1 is input to the NOT element 52*a* and a second input signal IN2 is input to the NOT element 52*b*. The second input signal IN2 is further-input to the NAND element 54*a*. The output of the NOT element 52*a* is input to the OR elements 56*a* and 56*b* and the AND element 56*c*. The output of the NOT element 52*b* is input to the NAND element 54*b*. Further, the output of the NAND element 54*a* is input to the OR element 56*a,* and the output of the NAND element 54*b* is input to the OR element 56*b*.

The output A of the OR element 56*a* is input to a gate of the MOSFET 62 in the switching control section 60 and is also input to the AND element 56*c* and the NAND element 54*b* forming the multivibrator circuit. The output B of the OR element 56*b* is input to a gate of the MOSFET 64 in the switching control section 60 and is also input to the AND element 56*c* and the NAND element 54*a* forming the multivibrator circuit. The output C of the AND element 56*c* is input to a gate of the MOSFET 66 in the switching control section 60 and is also input to the OR elements 56*a* and 56*b*.

A first voltage $V_{high}$ is applied to a source of the MOSFET 62 in the switching control section 60, a second voltage $V_{mid}$ which is lower than the first voltage $V_{high}$ is applied to a source of the MOSFET 64, and a third voltage $V_{low}$ which is lower than the second voltage $V_{mid}$ is applied to a source of the MOSFET 66. The first voltage $V_{high}$, the second voltage $V_{mid}$, and the third voltage $V_{low}$ can be 3V, −5V, and −7V, respectively, for example. Drains of the MOSFETs 62, 64, and 66 are connected to a common output terminal.

Figure 6:
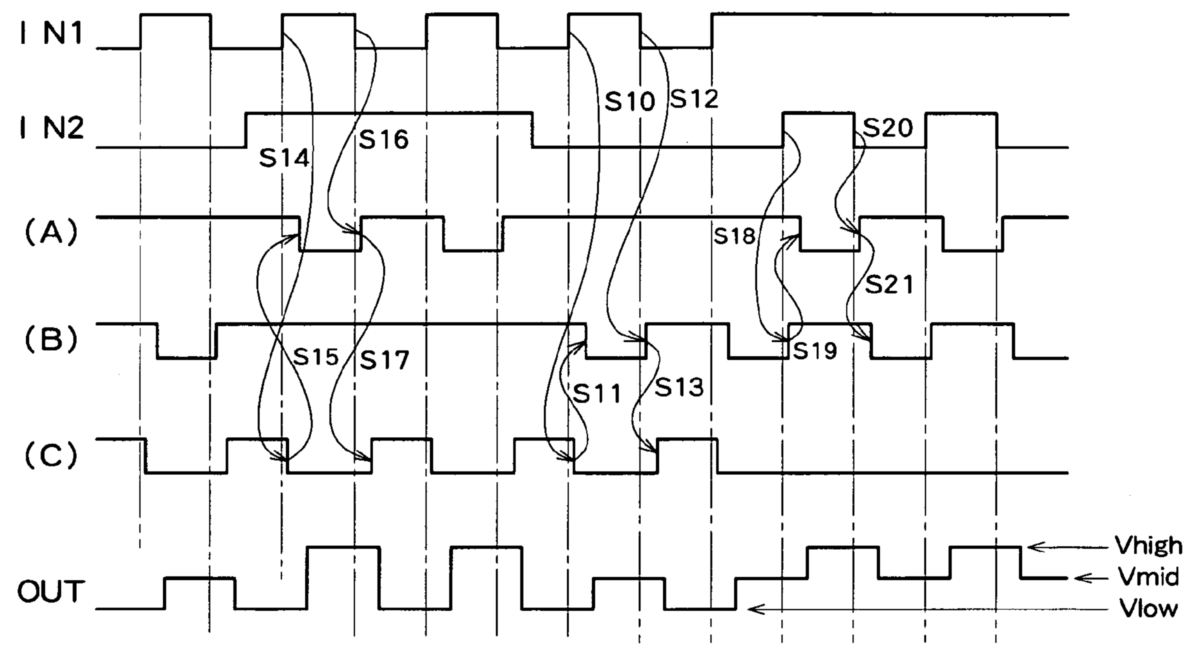
FIG. 6 is a timing chart showing the operation of the ternary pulse generation circuit according to the third embodiment of the present invention.

Referring to FIG. 6, the operation of the ternary pulse generation circuit 300 will be described. FIG. 6 is a timing chart showing changes of the outputs A, B, and C, and the output signal OUT with respect to the states of the first and second input signals IN1 and IN2.

When both the first input signal IN1 and the second input signal IN2 are at a low level, all of the outputs A, B, and C are at a high level. Thus, only the MOSFET 66 turns ON while the MOSFETs 42 and 44 are OFF. Consequently, the output signal OUT has the third voltage value $V_{low}$.

Then, when the first input signal IN1 changes to a high level while the second input signal IN2 remains at a low level, first, the output C of the AND element 56*c* changes to a low level (step S10). Subsequently, in response to the change of the AND element 56*c*, the output B of the OR element 56*b* changes to a low level (step S11). Namely, after the MOSFET 66 is turned in an OFF state, only the MOSFET 64 is ON. Consequently, the voltage of the output OUT switches from the third voltage value $V_{low}$ to the second voltage value $V_{mid}$.

When the first input signal IN1 is changed back to a low level while the second input signal IN2 remains at a low level, the output B of the OR element 56*b* returns to a high level some time later than the change of the input signal IN1 (step S12), and the output C of the AND element 56*c* changes to a high level at a time later than the change of the OR element 56*b* (step S13). Consequently, the voltage value of the output signal OUT returns to the third voltage $V_{low}$.

When the second input signal IN2 changes to a high level while the first input signal IN1 remains at a low level, the state in which all the outputs A, B, and C are at a high level is maintained. Consequently, only the MOSFET 66 is ON so that the output signal OUT maintains the third voltage value $V_{low}$.

Then, when the first input signal IN1 changes to a high level while the second input signal IN2 remains at a high level, first, the output C of the AND element 56*a* changes to a low level (step S14). Subsequently, in response to the change of the output C of the AND element 56*a*, the output A of the AND element 56*b* changes to a low level (step S15). Namely, after the MOSFET 66 turns OFF, only the MOSFET 62 is in an ON state. Consequently, the voltage of the output OUT switches from the third voltage value $V_{low}$ to the first voltage value $V_{high}$.

When the first input signal IN1 returns to a low level while the second input signal IN2 remains at a high level, the output A of the OR element 56*a* changes again to a high level some time later than the change of the input signal IN1 (step S16), and the output C of the AND element 56*c* changes to a high level at a time later than the change of the OR element 56*a* (step S17). Consequently, the voltage value of the output signal OUT changes back to the third voltage $V_{low}$.

Then, when the second input signal IN2 changes from a low level to a high level while the first input signal IN1 remains at a high level, first, the output B of the OR element 56*b* changes to a high level (step S18). Subsequently, in response to the change of the output B of the OR element 56*b*, the output A of the OR element 56*a* changes to a low level (step S19). Namely, after the MOSFET 64 turns OFF, only the MOSFET 62 is in an ON state. Consequently, the voltage of the output OUT switches from the second value $V_{mid}$ to the first voltage value $V_{high}$.

When the second input signal IN2 returns to a low level while the first input signal IN1 remains at a high level, the output A of the OR element 56*a* changes again to a high level some time later than the change of the input signal IN2 (step S20), and the output B of the OR element 56*b* changes to a low level at a time later than the change of the output A (step S21). Consequently, the voltage value of the output signal OUT changes back to the second voltage $V_{mid}$.

As described above, it is possible to switch the output signal OUT between the first voltage value $V_{high}$ and the second voltage value $V_{mid}$, between the first voltage value $V_{high}$ and the third voltage value $V_{low}$, or between the second voltage value $V_{mid}$ and the third voltage value $V_{low}$, while controlling the switching elements of the switching control section 60 such that only one switching element is turned ON at one time.

In the logic circuit section 50, the output of the AND element 56*c* is fed back to the input of each of the OR elements 56*a* and 56*b* and also the outputs of the OR elements 56*a* and 56*b* are fed back, via the multivibrator, to the inputs of the OR elements 56*b* and 56*a*, respectively. By mutually feeding back the outputs of the three logic elements, namely the OR elements 56*a* and 56*b* and the AND element 56*c*, which output a control signal to the three MOSFETs 62, 64, and 66 which are switching elements as described above, it is possible to control the switching control section 60, namely the MOSFETs 62, 64, and 66, such that only one of these switching elements 62, 64, and 66 is turned ON. Specifically, it is possible to prevent the MOSFETs 62 and 64 from being simultaneously ON to thereby prevent connection of the sources of the MOSFETS 62 and 64, to prevent the MOSFETs 62 and 66 from being simultaneously ON to thereby prevent connection of the sources of the MOSFETs 62 and 66, and to prevent the MOSFETs 64 and 66 from being simultaneously ON to thereby prevent connection of the sources of the MOSFETs 64 and 66. As such, generation of a through current caused by turning a plurality of switching elements simultaneously ON can be prevented, so that the power consumption of the ternary pulse generation circuit 300 can be reduced.

In the ternary pulse generation circuit 300, if the condition of $(V_{high}-V_{mid})<(V_{mid}-V_{low})$ is satisfied, the use of the P-channel MOSFET 64 can prevent a reduction in the driving ability caused by a back-gate bias. It is therefore desirable to use the ternary pulse generation circuit 300 in the case of $(V_{high}-V_{mid})<(V_{mid}-V_{low})$. In the case of $(V_{high}-V_{mid})>(V_{mid}-V_{low})$, on the other hand, it is desirable to use the ternary pulse generation circuit 200.

Further, in the ternary pulse generation circuits 100, 200, and 300 of the first, second, and third embodiments, respectively, it is also possible to increase the driving voltages of the logic circuit sections 10, 30, and 50 to thereby increase the driving ability of the switching control sections 20, 40, and 60 provided downstream of the logic circuit sections.

It should be understood that the technical concept of the present invention is not limited to the specific embodiments described above, and the switching control section may be controlled using a logic circuit other than the logic circuits 10, 30, and 50. However, the logic circuits 10, 30, and 50 of the above embodiments are advantageous in their simpler and smaller structure than other logic circuits so that the manufacturing cost can be reduced.

While the preferred embodiments of the present invention have been described using specific terms, such description is for illustrative purposes only, and it is to be understood that changes and variations may be made without departing from the spirit or scope of the appended claims.

What is claimed is:

1. A ternary pulse generation circuit which outputs three different voltage values, comprising:

a logic circuit section including three logic elements; and a switching control section including three switching elements each controlled by an output of corresponding one of the three logic elements, wherein each of the three switching elements has one terminal to which each of three different voltage values is input and another terminal which outputs a voltage value, and the logic circuit section controls the three switching elements such that the three switching elements are not simultaneously turned on, thereby outputting the three different voltage values in a switching manner, wherein an output of one of the three logic elements is fed back to an input of at least one of other two logic elements.

2. The ternary pulse generation circuit according to claim 1, the logic circuit section is formed by including an OR element, a first AND element, and a second AND element, an output of the OR element is fed back to inputs of the first AND element and the second AND element, and outputs of the first AND element and the second AND element are fed back to an input of the OR element.

3. The ternary pulse generation circuit according to claim 1, wherein the logic circuit section is formed by including an OR element, a first AND element, a second AND element, and a multivibrator circuit, an output of the OR element is fed back to inputs of the first AND element and the second AND element, and outputs of the first AND element and the second AND element are fed back to an input of the OR element and also fed back, via the multivibrator circuit, to the inputs of the second AND element and the first AND element, respectively.

4. The ternary pulse generation circuit according to claim 1, wherein the logic circuit section is formed by including a first OR element, a second OR element, an AND element, and a multivibratot circuit, an output of the AND element is fed back to inputs of the first OR element and the second OR element, and outputs of the first OR element and the second OR element are fed back to an input of the AND element and also fed back, via the multivibrator circuit, to the inputs of the second OR element and the first OR element, respectively.

* * * * *